United States Patent [19]
Saitoh

[11] Patent Number: 5,492,864
[45] Date of Patent: Feb. 20, 1996

[54] METHOD AND EQUIPMENT FOR MANUFACTURING A SEMICONDUCTOR DEVICE

[75] Inventor: Yoshiharu Saitoh, Tokyo, Japan

[73] Assignee: NEC Corporation, Tokyo, Japan

[21] Appl. No.: 294,727

[22] Filed: Aug. 22, 1994

[30] Foreign Application Priority Data

Oct. 14, 1993 [JP] Japan ................... 5-257137

[51] Int. Cl.⁶ ................... H01L 21/44
[52] U.S. Cl. ............ 437/195; 437/235; 437/238; 437/228
[58] Field of Search ................... 437/195, 235, 437/238, 228

[56] References Cited

U.S. PATENT DOCUMENTS 5,204,288  4/1993  Marks et al. .
5,275,977  1/1994  Otsubo et al. ................ 437/235
5,352,630  10/1994  Kim et al. ................ 437/238

FOREIGN PATENT DOCUMENTS 4-162530  8/1992  Japan .

OTHER PUBLICATIONS

Semicon News, dated Jun. 1989, pp. 62–67.

Primary Examiner—George Fourson
Assistant Examiner—C. Everhart
Attorney, Agent, or Firm—Young & Thompson

[57] ABSTRACT

An object of the present invention is to realize a method of and equipment for manufacturing a semiconductor device which can improve the flatness of an interlayer insulating film and increase the reliability of the metal wiring of a second layer to be formed in a succeeding process. The method of manufacturing the semiconductor device of the present invention is characterized by a manufacturing process to be successively implemented comprising: a step for forming an insulating film by means of a chemical vapor deposition method on a semiconductor substrate having an electrode patterned thereon; a step for selectively removing the insulating film by using a reactive ion etching method and forming a side wall made of the insulating film on the patterned electrode; and a step for forming the insulating film by means of the chemical vapor deposition method while introducing excited halogen molecules at an excited molecule oscillation level.

6 Claims, 4 Drawing Sheets

METHOD AND EQUIPMENT FOR MANUFACTURING A SEMICONDUCTOR DEVICE

BACKGROUND OF THE INVENTION:

1. Field of the Invention:

The present invention relates to a method of and equipment for manufacturing a semiconductor device laying emphasis on an insulating film to be used for insulation between electrodes.

2. Description of the Related Art:

With reference to a method of leveling an interlayer insulating film to be applied in a wiring layer of the semiconductor device, a few composite processes have been proposed (for example, Semicon News: June 1989, pp. 62-67).

A representative method of leveling the interlayer insulating film will be described with reference to FIG. 1(a) to (d).

First, as shown in FIG. 1(a), aluminum electrodes 303 are formed on a ground insulating film (a silicon dioxide film formed by a thermal oxidation method or a CVD method, or a silicon nitride film formed by a CVD method) 302 provided on the surface of a semiconductor substrate 301. An insulating film 304 made of, for example, a silicon dioxide film, silicon nitride film or silicon oxynitride (SiON) film about 1 μm thick is formed by a plasma CVD method so as to cover the ground insulating film 302 and aluminum electrodes 303.

Then, as shown in FIG. 1(b), a SOG (Spin-on-Glass) film 305 is applied to the thus-produced flat reference wafer to a thickness in the range of 0.2 μm to 0.5 μm.

Next, as shown in FIG. 1(c), a dry etching method is employed to dry etch the SOG film 305 so as to leave the SOG film only on the side walls of the aluminum electrodes 303 and in small gaps therebetween.

Next, an annealing operation at about 370° C. is applied to the SOG film 305 in order to vaporize the contained moisture and to solidify the SOG film 305.

Finally, as shown in FIG. 1(d), an interlayer insulating film 306 made up of, for example, a silicon dioxide film, silicon nitride film or silicon oxynitride (SiON) film about 1 μm thick is grown thereon by the plasma CVD method to complete the leveling of the interlayer insulating film.

With the above-described manufacturing method, since the SOG film 305 remains on the side walls of the aluminum electrodes 303, unevenness on the covered interlayer insulating film 306 is improved. As a result, defects such as cracks or disconnections in the metal wiring of a second layer formed in a succeeding process will be reduced. In recent studies, methods for improving the flatness of the interlayer insulating film without using an SOG film have been investigated. For example, there is a method for leveling the surface by grinding the surface of the interlayer insulating film as disclosed in Japanese Patent Laid Open 92-162530.

The above manufacturing method will be described with reference to FIG. 2(a) to FIG. 2(c).

As shown in FIG. 2(a), aluminum electrodes 403 which serve as the metal wiring are first formed on a 10 semiconductor substrate 401 which has a ground insulating film 402 formed thereon in advance, following which a silicon dioxide film (hereinafter referred to as a P—SiO film) 407 2 to 5 μm thick is formed thereon by means of a plasma CVD method.

Next, as shown in FIG. 2(b), the P—SiO film 407 is ground from its outermost surface until its thickness on the aluminum electrode 403 is within the range of 0.5 to 1.0 μm, thereby producing a wafer with a completely flat surface.

Next, as shown in FIG. 2(c), a silicon nitride film (hereinafter referred to as a P—SiN film) 408 0.2 μm to 0.5 μm thick is grown thereon as a dampproof film by means of a plasma CVD method. Since the surfaces of the P—SiO film 407 and P—SiN film 408, which function as interlayer insulating films, are made perfectly flat, defects such as cracks or disconnections in the metal wiring of the second metal layer to be formed in a succeeding process are greatly reduced, thereby improving the reliability of the semiconductor device.

However, the above-described conventional manufacturing method for leveling the interlayer insulating film has the following defects when using an SOG film.

First, to improve the reliability of the metal wiring of the second wiring layer, the surface of the interlayer insulating film must be sufficiently flat. To achieve this degree of flatness, the SOG film must remain in sufficient thickness on the side walls of the aluminum electrode 303. On the other hand, if the SOG film 305 is thickly coated, cracks tend to be generated in the SOG film during annealing for burning and solidifying the film. Maintaining proper control of the manufacturing conditions is therefore very difficult.

Second, since the SOG film 305 contains considerable moisture, high-temperature annealing is indispensable to evaporate the moisture and solidify the film. However, since the SOG film 305 has been coated on the aluminum electrode 303, the annealing temperature must be limited to 400° C. or less to prevent melting, corrosion or deterioration of the aluminum electrode 303. However, because it is impossible to completely remove the moisture contained in the SOG film 305 at such an annealing temperature, defects such as corrosion of the wiring layer result, thereby lowering the reliability of the semiconductor device.

There is an additional problem in the conventional method which utilizes the grinding process for the interlayer insulating film. First, when a P—SiO film 407 is formed by the plasma CVD method, if the space between lines of the aluminum electrodes 403 is narrow and the aspect ratio of the electrode is high, the reactive gas cannot flow smoothly into the space between the wiring composed of aluminum electrodes 403. In this case, the reactive gas molecules fail to reach the bottom of the space between the wiring, and as a result, the growth rate of the P—SiO film 407 is at a maximum at the upper corner of the metal wiring and tends to gradually diminish with increasing depth in the spaces between wiring. If the P—SiO film continues to grow, the film thickness increases rapidly at the upper corner portions of the wiring. The gradually overhanging growth at corner portions on opposite sides of a space eventually contact, thereby causing a void between the wiring.

When a void is formed in the interlayer insulating film, contaminant may be trapped in the void, resulting in the serious degradation of the reliability of the semiconductor device. Particularly, there is a probability that abrasives used in a succeeding grinding process of the insulating film will be trapped in the voids, thereby causing deterioration of the quality.

SUMMARY OF THE INVENTION

The present invention has been developed in view of the problems encountered in the conventional technology described above. It is an object of the present invention to realize a method of manufacturing a semiconductor device which can improve the flatness of an interlayer insulating film and increase the reliability of the metal wiring of a second layer to be formed in a succeeding process.

A method of manufacturing a semiconductor device according to the present invention is characterized in that the manufacturing steps are successively implemented and comprise the steps of:

forming an insulating film by means of a chemical vapor deposition method on a semiconductor substrate having a patterned electrode formed thereon;

selectively removing the insulating film according to a reactive ion etching method and forming a side wall on the patterned electrode with the insulating film; and forming an insulating film by the chemical vapor deposition method while introducing excited halogen molecules of an excited molecule oscillation level.

Equipment for manufacturing the semiconductor device of the present invention having a chemical vapor deposition apparatus including a set of parallel plate electrodes is characterized in that a hot jet nozzle and heater are mounted on the electrode on which a semiconductor substrate is not placed.

According to the method of the present invention, excited halogen molecules of a molecule oscillation level excited by a hot jet nozzle are introduced during a time period in which an insulating film is formed by a plasma vapor deposition method.

The excited halogen molecules are able to etch the surface of an exposed metal with high probability. Accordingly, metal atoms are continuously etched, thereby precluding formation of a seed which is indispensable for the growth of a film and thus preventing the growth of the film.

On areas other than the exposed metal surface, since there are no metal atoms which promote deexcitation of the excited halogen molecule, surface etching does not proceed, thereby causing the insulating film to grow. As a result, selective growth is realized in which the insulating film grows on areas other than the exposed metal surface.

In the present invention, inasmuch as the insulating film is formed by means of the above plasma vapor deposition method after the insulator is formed on the side wall of the metal electrode by using a reactive ion etching method, the insulating film is formed without generating voids between metal electrodes.

It is possible to realize the selective growth of the insulating film by introducing a halogen element gas into the hot jet nozzle mounted on the upper electrode of the plasma chemical vapor deposition apparatus comprising parallel flat electrodes.

DETAILED DESCRIPTION OF THE PREFERRED EMBODIMENTS

An embodiment of the present invention will next be described in detail with reference to the drawings.

Figure 1A:
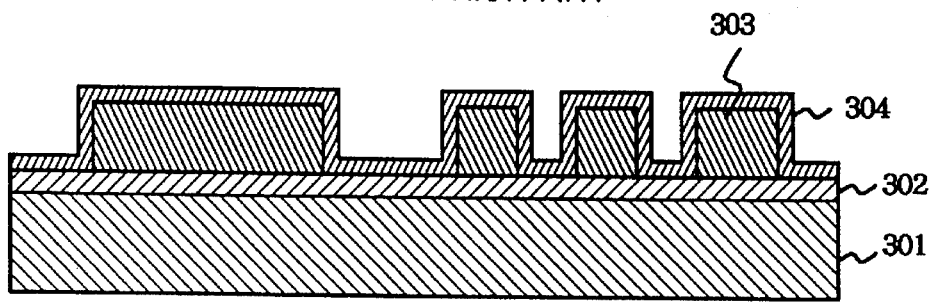
FIGS. 1(a)–1(d) are a sectional view showing a process of a conventional manufacturing method of a semiconductor device.
Figure 1B:
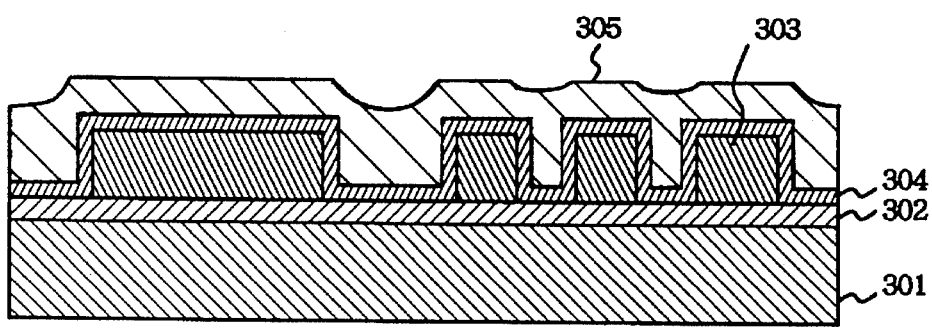
Figure 1C:
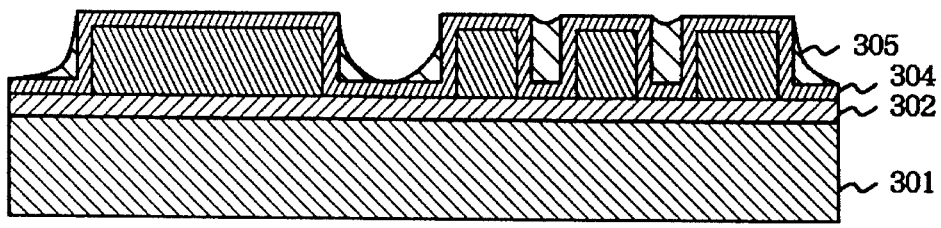
Figure 1D:
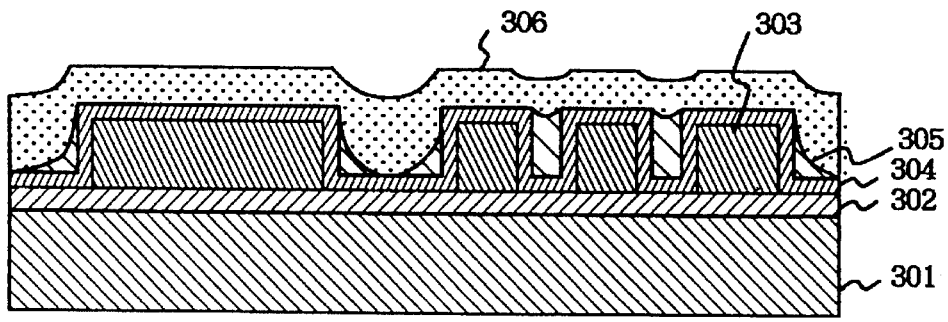
Figure 2A:
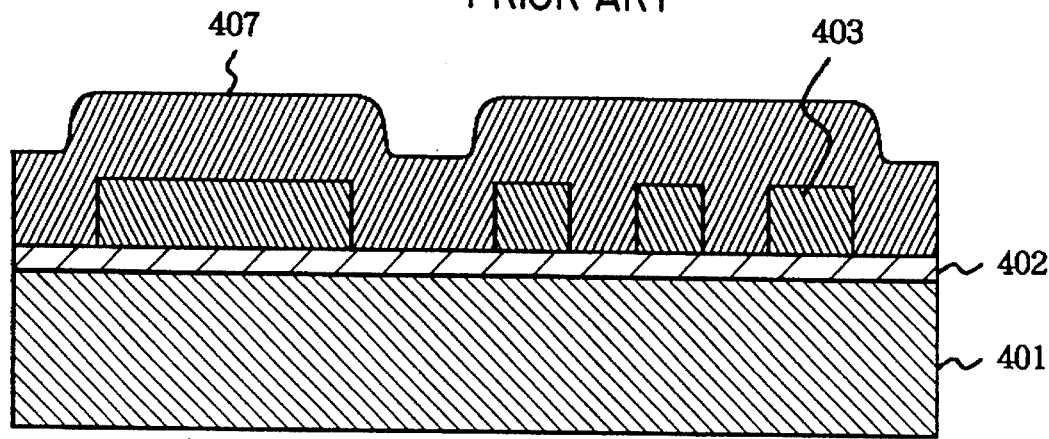
FIGS. 2(a)–2(c) are a sectional view showing a process of a conventional manufacturing method of a semiconductor device.
Figure 2B:
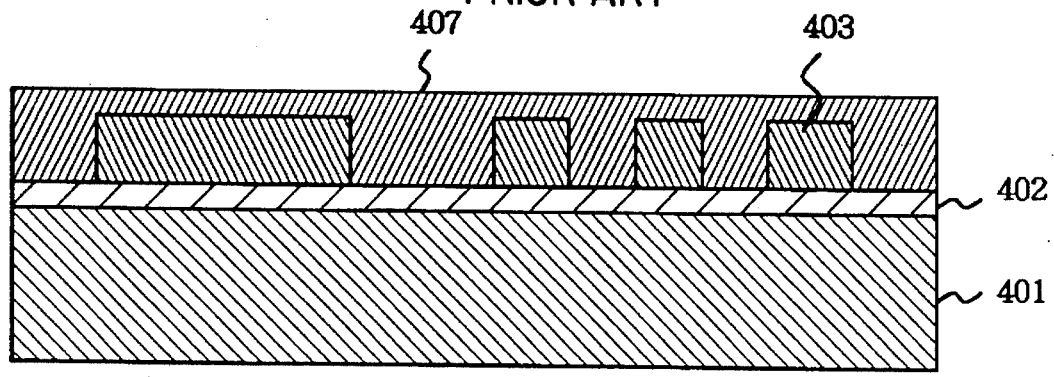
Figure 2C:
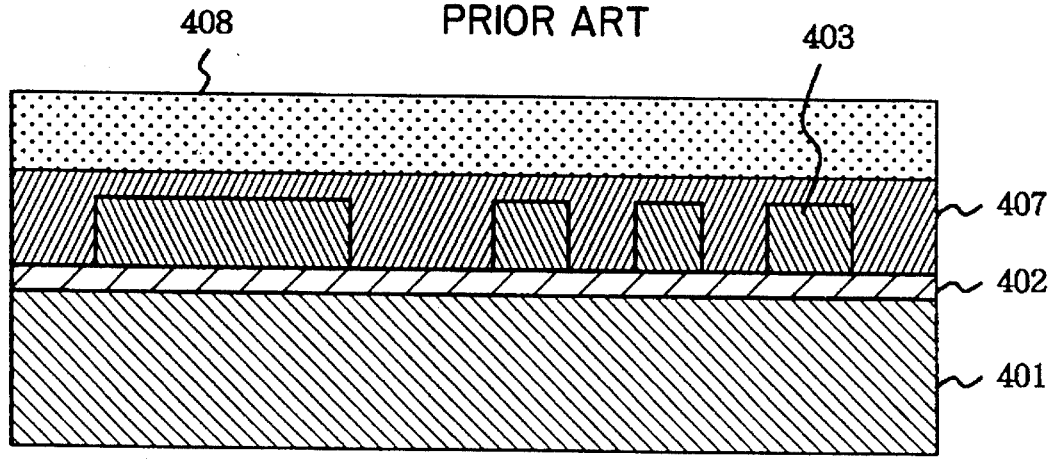
Figure 3:
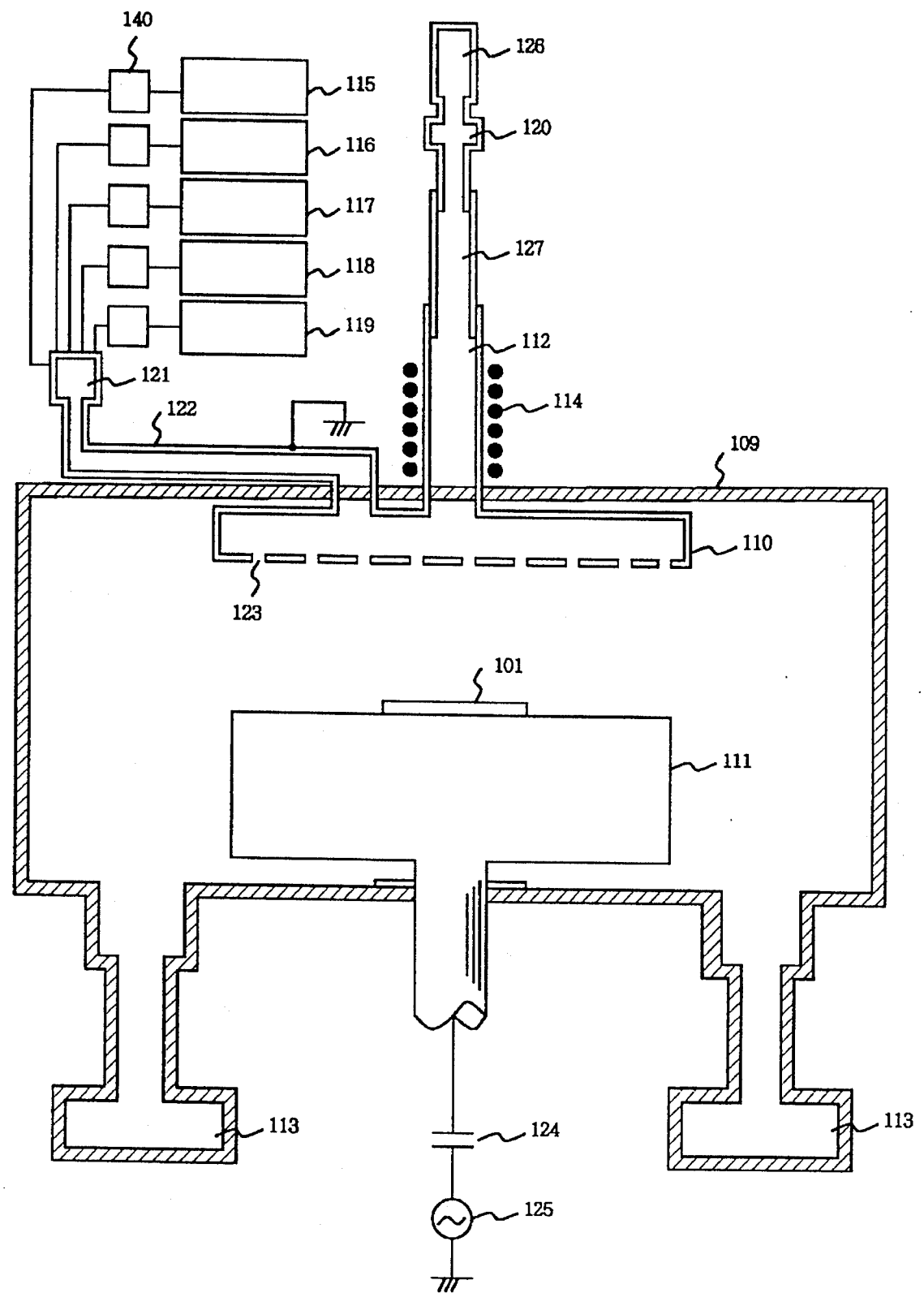
FIG. 3 is a diagram showing the structure of an embodiment of manufacturing equipment of the semiconductor device of the present invention.

FIG. 3 is a structural view of an embodiment of a plasma vapor deposition apparatus according to the present invention.

The equipment of the present embodiment is characterized by having a deposition chamber 109 which includes an upper electrode 110 and a lower electrode 111, and having a hot jet nozzle 112 mounted on the upper electrode 110.

The inside of the deposition chamber 109 is vacuum exhausted by a vacuum exhaust pump 113 and maintained at a pressure of 0.1 Pa. A semiconductor substrate 101 having an aluminum electrode patterned thereon is placed on the lower electrode 111 which is maintained at 250° C. by an incorporated heater (not shown).

A method of selectively growing an insulating film on a substrate wafer through a step having four stages using a plasma vapor deposition apparatus of the present embodiment will be described below.

Figure 4A:
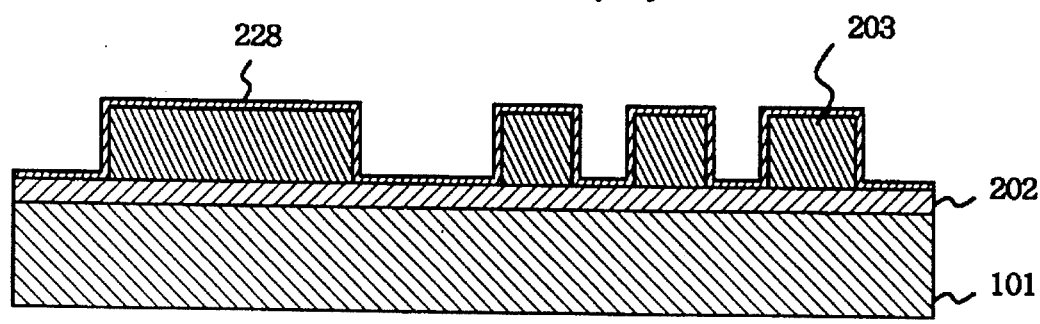
FIGS. 4(a)–4(d) are a sectional view showing a process of a manufacturing method of the semiconductor device of the present invention.

First, as shown in FIG. 4(a), on the surface of the semiconductor substrate 101 before the insulating film is formed thereon, a ground insulating film 202 (a silicon dioxide film formed by a thermal oxidation method or a CVD method, or a silicon nitride film formed by a CVD method) is formed, and aluminum wiring 203 is patterned thereon.

This semiconductor substrate 101 is placed on the lower electrode 111 of the plasma vapor deposition apparatus (FIG. 3) of the present embodiment. The temperature of the lower electrode 111 is held at 250° C., and the inside of the plasma chamber 109 is exhausted by the vacuum exhaust pump 113 and held at a pressure of 10 Pa.

In this first step, as shown in FIG. 4(a), an insulating film 228 50 angstrom thick is formed over the entire surface of the semiconductor substrate 101, while a combination of growth gases introduced into the plasma chamber 109 is varied according to the kind of the insulating film 228 being formed.

When a silicon oxide film ($SiO_x$) must be grown to form the insulating film 228, 40 sccM of monosilane ($SiH_4$) gas is introduced from a monosilane ($SiH_4$) cylinder 115 through a mass flow controller 140 and 100 sccM of nitrous oxide ($N_2O$) gas is introduced from a nitrous oxide ($N_2O$) cylinder 116 through the mass flow controller 140, both gasses being introduced into a gas mixer 121, and the mixed gasses are then supplied to the deposition chamber 109 from shower inlet ports 123 through an introduction tube 122.

When a silicon nitride film ($SiN_x$) must be grown to form the insulating film 228, a nitrous oxide for growing the silicon oxide ($SiO_x$) is changed to ammonia ($NH_3$), and 80 sccM of ammonia ($NH_3$) gas is introduced from an ammonia ($NH_3$) cylinder 117 through the mass flow controller 140 into the gas mixer 121 to be mixed there with the monosilane ($SiH_4$) gas and supplied to the deposition chamber 109.

When high frequency waves of 13.56 MHz, 150 W are impressed from a high frequency oscillator 125 on the lower electrode 111, a glow discharge phenomenon occurs between the upper electrode 110 and the lower electrode 111, thereby effectively changing the growth gas to plasma.

As a result of the above process, the insulating film 228 is formed over the entire surface of the semiconductor substrate 101. The growth according to this insulating film forming method is called nonselective growth. After this growth has continued for about one minute, impressing of the high frequency waves and introduction of the growth gas are stopped. As a result, as shown in FIG. 4(a), the insulating film 228 is formed over the entire surface with a thickness of about 50 angstrom.

In a second step immediately after the first step is completed, 30 sccM of carbon tetrafluoride gas (CF₄) is introduced from a carbon tetrafluoride gas (CF₄) cylinder 118 through the mass flow controller 140 and 10 sccM of hydrogen (H₂) gas is introduced from a hydrogen (H₂) gas cylinder through the mass flow controller 140, and both gasses are mixed in the gas mixer 121 and then supplied to the deposition chamber 109 through shower inlet ports 123. The deposition chamber 109 is exhausted by the vacuum exhaust pump 113 and maintained at pressure of $10^{-2}$ Pa.

When high frequency waves of 13.56 MHz, 200 W are impressed from the high frequency oscillator 125 on the lower electrode 111, the glow discharge phenomenon occurs between the upper electrode 110 and the lower electrode 111, thereby effectively changing the introduced gas to plasma. Since the mobility of electrons in the generated plasma is very large compared to that of ions, the electrons flow toward the upper electrode 110 which serves as an anode. As a result, an electric current flows between both electrodes, thereby accumulating electric charge in a blocking capacitor 124. When the electric charge is accumulated in the blocking capacitor 124 while concurrently applying high-frequency voltage between two electrodes, there occurs a cathode drop producing an ion sheath layer near the surface of the lower electrode 111. In this ion sheath layer, active ion particles are accelerated by the vertical electric field and the reactive etching activity proceeds only in that direction.

When the carbon tetrafluoride gas (CF₄) is used as the reactive gas, a CF₃ ion generated in the plasma is accelerated by the vertical electric field to react with the insulating film 228 as shown in the following formula, thereby causing the anisotropic etching to proceed.

(1) In the case of $SiO_x$:

(1)

(2) In the case of $SiN_x$:

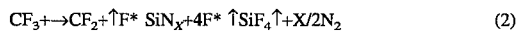
(2)

Figure 4B:
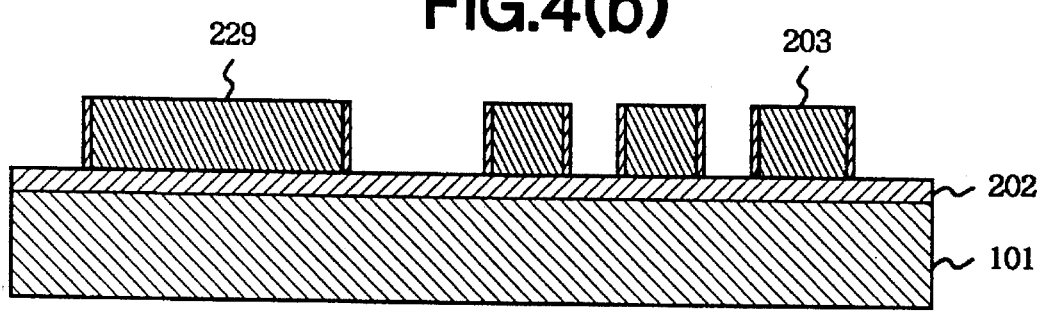

The CF₃+ ions which attack the surface of the insulating film 228 generate a fluorine radical (F*) on the surface, and the fluorine radical (F*) thus produced then reacts with the insulating film 228 generating a volatile silicon tetrafluoride (SiF₄), thereby accelerating etching activity. This method is called the reactive ion etching (RIE) method and causes etching to the insulating film 228 only in the vertical direction. Therefore, as shown in FIG. 4(b), the insulating film 228 remains on the side of the aluminum electrode 203 in the form of a side wall, and the insulating film 228 on the surface of the aluminum electrode 203 is removed to show an exposed aluminum surface 229.

If the insulating film is 50 angstrom thick, after etching has been carried out for 30 seconds, impressing of the high-frequency wave and introduction of the reactive gas are stopped to halt the etching activity. Hydrogen (H₂), which is another component of the reactive gas, prevents reunion of the CF₃+ions, prolonging the life thereof, and is therefore effective for increasing the etching speed.

Descriptions of the first step and the second step are identical to those of the conventional technique and are well known to person skilled in the art.

The third step comprises a process to selectively grow the insulating film on areas other than the exposed aluminum surface 229 on the semiconductor substrate 101. This process is a feature of the present invention.

In the second step, the insulating film 228 is allowed to remain on the side of the aluminum electrode 203 in a form of a side wall. The reason for this is that, if there is no insulating film on the side wall, the insulating film will fail to further grow on the side wall in the next process to selectively grow the insulating film, thereby causing a void to be contained in the film. With a combination of the growth gas similar to that of the first step and under similar growth temperature and conditions for impressing the high frequency wave, the process for the growth of the insulating film of $SiO_x$ or $SiN_x$ is performed while chlorine (Cl₂) gas is concurrently introduced from a chlorine (Cl₂) gas cylinder 126 to the hot jet nozzle 112 mounted on the upper electrode 110 through the mass flow controller 120 and an alumina gas inlet tube 127.

The hot jet nozzle 112 is already heated to about 2000° C. by the heater 114, and the introduced chlorine gas is heated to about 2000° C. while it flows and enters the deposition chamber 109 through the shower inlet port 123. Further, when the chlorine gas bursts forth, the momentum of the molecules is made uniform due to molecule collision during the adiabatic expansion, and thus the molecule oscillation level is excited.

The excited Cl* molecules have a high reaction probability for etching the exposed aluminum surface 229, and being deexcited on the surface of the aluminum, the Cl* molecules promote the following reaction for etching of the exposed aluminum surface 229.

(3)

In this reaction, the volatile reactive substance is aluminum trichloride (AlCl₃). On the insulating film 228 and the ground insulating film 202, both formed on areas other than the exposed aluminum surface 229, there are no atoms such as aluminum which promote deexciting of the excited Cl₂* molecules, with the result that an etching reaction is not generated on the surface of the insulating film. As a result, the insulating film grows on areas other than the exposed aluminum surface 229. However, on the exposed aluminum surface 229, the aluminum atoms are continuously etched and the formation of a seed necessary for the growth of the insulating film is prevented, and therefore, there is no growth of the insulating film. The selective growth of the insulating film is realized in this way.

Figure 4C:
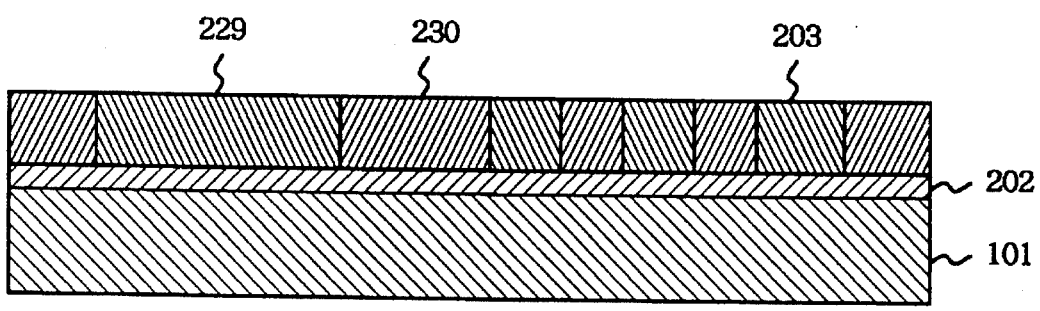

FIG. 4(c) shows the result of the selective growth of the insulating film 230. It shows a state in which the insulating film 230 has completely filled up the space between the aluminum electrodes 203 and in which no insulating film has grown on the exposed aluminum surface 229.

In the third step, the selective growth is continued until the insulating film 230 reaches the same thickness as that of the aluminum electrode 203. If the thickness of the aluminum electrode 203 is 1 μm, 50 minutes are required to attain the required growth, and the growth can be stopped by concurrently suspending introduction of the growth gas, introduction of the chlorine (Cl₂) gas to the hot jet nozzle 112, and impressing of the high frequency waves on the lower electrode 111.

Figure 4D:
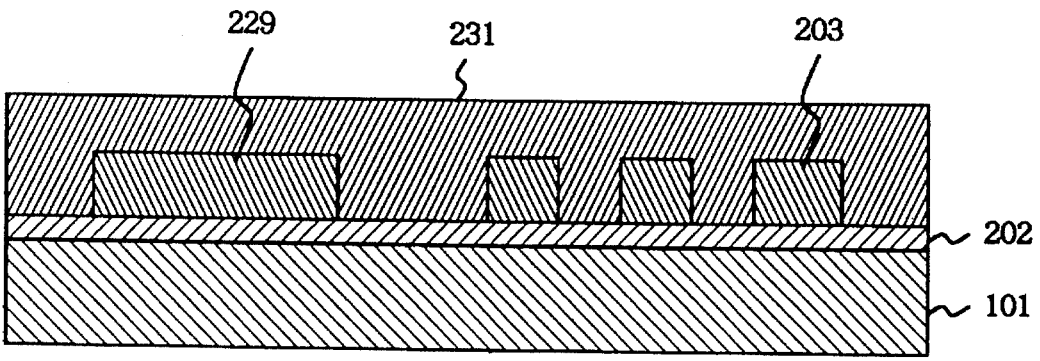

In the fourth step, the nonselective growth of the insulating film 231 is performed under nearly the same conditions as in step 1. As a result, as shown in FIG. 4(d), the insulating film 231 is grown over the entire surface including the exposed aluminum surface 229, thereby causing the entire surface to be level.

In the method of growing the insulating film according to the present invention, since the insulating film is provided for filling up the space between aluminum electrodes based on the selective growth technique, unevenness in the covered surface on the process of growth is not a concern, and in addition, filling of the spaces without inclusion of any voids can be achieved and complete flatness of the insulating film can be attained. Further, since it is possible to carry out the whole process successively on the same chemical vapor deposition apparatus, an increase in throughput can also be expected.

A second embodiment of the present invention will next be described. In the chemical vapor deposition apparatus of FIG. 3, the selective growth of the insulating film is performed by using bromine ($Br_2$) gas in place of chlorine ($Cl_2$) gas which is introduced to the hot jet nozzle 112.

In the same way as the chlorine ($Cl_2$) gas, the bromine ($Br_2$) gas molecules introduced to the hot jet nozzle 112 become excited molecules $Br_2^*$ which attack the exposed aluminum surface 229, thereby promoting the following reaction to generate a volatile aluminum bromide ($AlBr_3$).

$$Al + 3/2 Br_2^* \rightarrow AlBr_3 \uparrow \qquad (4)$$

The exposed aluminum surface 229 is etched according to the above reaction, thereby achieving selective growth of the insulating film. However, the etching reaction probability of the above gas is about 50% lower than that of the excited chlorine molecule $Cl_2^*$, and hence, the film of the aluminum electrode 203 can be advantageously limited to a small value.

With reference to the above embodiments, it has been described that the metal electrode is made of aluminum, but the kind of metal need not be limited, and any other metal can be used, except gold, platinum or the like which are hard to etch, without detracting from the effectiveness of the present invention.

Further, the kind and concentration of the excited halogen molecules to be introduced for performing plasma vapor deposition are not particularly limited. In the second embodiment, it is shown that the etching characteristic can be varied by changing the excited halogen molecules of the first embodiment, but it is also possible to vary the etching characteristic by mixing the halogen gas with another gas.

Hitherto, it has been described that the hot jet nozzle 112 is mounted on the upper electrode of a set of parallel flat plate electrodes that make up the upper electrode 110 and the lower electrode 111, but the hot jet nozzle is reasonable and acceptable as long as it is provided at a position opposite the semiconductor substrate 101. Therefore, for example, when the semiconductor substrate 101 is attached to the upper electrode in the form of phase-down, the hot jet nozzle may be provided on the lower electrode.

Further, while it has been described that the plasma vapor deposition method is applied for forming the insulating film while introducing the excited halogen molecules, the present invention is applicable to all kinds of chemical vapor deposition methods and not limited to the plasma method described above.

Since the present invention is structured as described above, it has the following advantages:

The present invention is effective for forming an interlayer insulating film which is completely flat without having any voids. According to the present invention, the flatness of the interlayer insulating film, regarding which problems were encountered in conventional techniques, has been greatly improved, thereby increasing the reliability of the metal wiring of a second layer to be formed in a succeeding process.

What is claimed is:

1. A method of manufacturing a semiconductor device by successively implementing manufacturing steps comprising:

a first step of forming a first insulating film by means of a chemical vapor deposition method on a semiconductor substrate having an electrode patterned thereon;

a second step of selectively removing said first insulating film by using a reactive ion etching method and forming a side wall made of said first insulating film on said patterned electrode;

a third step of growing a second insulating film by means of the chemical vapor deposition method while introducing excited halogen molecules at an excited molecule oscillation level.

2. The method of manufacturing the semiconductor device according to claim 1 wherein the excited halogen molecules introduced in the third step are chlorine molecules.

3. The method of manufacturing the semiconductor device according to claim 1 wherein the excited halogen molecules introduced in the third step are bromine molecules.

4. The method of manufacturing the semiconductor device according to claim 1 wherein the chemical vapor deposition method to be implemented in the third step is a plasma vapor deposition method.

5. The method of manufacturing the semiconductor device according to claim 2 wherein the chemical vapor deposition method to be implemented in the third step is a plasma vapor deposition method.

6. The method of manufacturing the semiconductor device according to claim 3 wherein the chemical vapor deposition method to be implemented in the third step is a plasma vapor deposition method.

\* \* \* \* \*